US012689178B2

(12) United States Patent
Zheng et al.

(10) Patent No.: US 12,689,178 B2
(45) Date of Patent: Jul. 21, 2026

(54) HIGH PEAK POWER LASER DIODE ASSEMBLY

(71) Applicant: LEONARDO ELECTRONICS US INC., Tucson, AZ (US)

(72) Inventors: Lihui Zheng, Tucson, AZ (US); Gregory Pennington, Tucson, AZ (US); Jason Helmrich, Tucson, AZ (US); Connor Magness, Tucson, AZ (US); Prabhuram Thiagarajan, Tucson, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 654 days.

(21) Appl. No.: 18/115,615

(22) Filed: Feb. 28, 2023

(65) Prior Publication Data

US 2023/0283043 A1 Sep. 7, 2023

Related U.S. Application Data

(60) Provisional application No. 63/315,497, filed on Mar. 1, 2022.

(51) Int. Cl.
*H01S 5/024* (2006.01)
*H01S 5/00* (2006.01)
*H01S 5/40* (2006.01)

(52) U.S. Cl.
CPC .......... *H01S 5/02469* (2013.01); *H01S 5/005* (2013.01); *H01S 5/4031* (2013.01)

(58) Field of Classification Search
CPC .. H01S 5/4025; H01S 5/4031; G02B 19/0057
See application file for complete search history.

(56) References Cited

U.S. PATENT DOCUMENTS 3,613,028 A 10/1971 Seidel
3,711,939 A 1/1973 Stoll ............................ 228/246
(Continued)

FOREIGN PATENT DOCUMENTS

CA 2208370 7/2005
CN 206322997 7/2017 ........... H01S 3/0941
(Continued)

OTHER PUBLICATIONS

Search Report issued in related German Patent Application 10 2019 121 924.8, dated Apr. 25, 2024, with English translation, 16 pages.
(Continued)

*Primary Examiner* — Minsun O Harvey
*Assistant Examiner* — Alexander Ehrlich
(74) *Attorney, Agent, or Firm* — HAYES SOLOWAY P.C.

(57) ABSTRACT

A laser diode apparatus includes a laser diode array having an emission surface and a mounting surface. A heatsink is in thermal communication with the laser diode array at the mounting surface. The heatsink extends perpendicularly away from at least one edge of the emission surface. Positive and negative electrical terminal blocks are in mechanical communication with the heatsink opposite the laser diode array. Electrical foils are in electrical communication with the laser diode array and the positive and negative terminals. The electrical foils extend perpendicularly away from the emission surface. The positive and negative electrical terminal blocks are electrically isolated from the heatsink. A cross-sectional footprint of the heatsink, positive and negative electrical terminal blocks, and electrical foils is not larger than 120% of a cross-sectional footprint of the laser diode array.

20 Claims, 8 Drawing Sheets

(56) References Cited

U.S. PATENT DOCUMENTS

| | | | | |
|---|---|---|---|---|
| 3,805,375 | A | 4/1974 | LaCombe et al. | 29/832 |
| 3,936,322 | A | 2/1976 | Blum et al. | 148/1.5 |
| 4,092,614 | A | 5/1978 | Sakuma et al. | |
| 4,156,879 | A | 5/1979 | Lee | 357/22 |
| 4,306,278 | A | 12/1981 | Fulton et al. | 362/259 |
| 4,653,056 | A | 3/1987 | Baer et al. | |
| 4,767,674 | A | 8/1988 | Shirai | 257/E23.006 |
| 4,803,691 | A | 2/1989 | Scifres et al. | 372/150 |
| 4,881,237 | A | 11/1989 | Donnelly | |
| 4,903,274 | A | 2/1990 | Taneya et al. | |
| 4,947,401 | A | 8/1990 | Hinata et al. | |
| 4,980,893 | A | 12/1990 | Thornton et al. | |
| 4,993,148 | A | 2/1991 | Adachi | 174/252 |
| 5,008,737 | A | 4/1991 | Burnham et al. | 357/81 |
| 5,031,187 | A | 7/1991 | Orenstein et al. | |
| 5,040,187 | A | 8/1991 | Karpinski | |
| 5,045,972 | A | 9/1991 | Supan | C22C 26/00 |
| 5,060,237 | A | 10/1991 | Peterson | |
| 5,061,974 | A | 10/1991 | Onodera et al. | |
| 5,099,488 | A | 3/1992 | Ahrabi et al. | |
| 5,102,825 | A | 4/1992 | Brennan et al. | 437/129 |
| 5,105,429 | A | 4/1992 | Mundinger et al. | |
| 5,105,430 | A | 4/1992 | Mundinger et al. | |
| 5,128,951 | A | 7/1992 | Karpinski | |
| 5,140,466 | A | 8/1992 | Parker | G02B 27/18 |
| 5,166,761 | A | 11/1992 | Olson | H01L 31/0725 |
| 5,202,706 | A | 4/1993 | Hasegawa | 359/819 |
| 5,212,706 | A | 5/1993 | Jain | |
| 5,212,707 | A | 5/1993 | Heidel et al. | |
| 5,253,260 | A | 10/1993 | Palombo | 372/34 |
| 5,284,790 | A | 2/1994 | Karpinski | |
| 5,298,762 | A | 3/1994 | Ou | 257/13 |
| 5,305,344 | A | 4/1994 | Patel | |
| 5,311,530 | A | 5/1994 | Wagner et al. | 372/36 |
| 5,311,535 | A | 5/1994 | Karpinski | |
| 5,325,384 | A | 6/1994 | Herb et al. | |
| 5,394,426 | A | 2/1995 | Joslin | |
| 5,418,799 | A | 5/1995 | Tada | |
| 5,440,577 | A | 8/1995 | Tucker | |
| 5,450,430 | A | 9/1995 | Chang | 372/38 |
| 5,455,738 | A | 10/1995 | Montesano et al. | 361/707 |
| 5,497,391 | A | 3/1996 | Paoli | |
| 5,504,767 | A | 4/1996 | Jamison et al. | |
| 5,521,931 | A | 5/1996 | Biegelsen et al. | 372/36 |
| 5,526,373 | A | 6/1996 | Karpinski | |
| 5,568,498 | A | 10/1996 | Nilsson | |
| 5,593,815 | A | 1/1997 | Ahn | 430/321 |
| 5,627,850 | A | 5/1997 | Irwin et al. | |
| 5,644,586 | A | 7/1997 | Kawano et al. | |
| 5,679,963 | A | 10/1997 | Klem et al. | 257/46 |
| 5,764,675 | A | 6/1998 | Juhala | |
| 5,778,020 | A | 7/1998 | Gokay | |
| 5,783,316 | A | 7/1998 | Colella et al. | |
| 5,812,573 | A | 9/1998 | Shiomi et al. | |
| 5,835,515 | A | 11/1998 | Huang et al. | |
| 5,835,518 | A | 11/1998 | Mundinger et al. | 372/50 |
| 5,848,083 | A | 12/1998 | Haden et al. | 372/36 |
| 5,856,990 | A | 1/1999 | Nilsson | 359/344 |
| 5,909,458 | A | 6/1999 | Freitas et al. | 372/36 |
| 5,913,108 | A | 6/1999 | Stephens et al. | |
| 5,923,692 | A | 7/1999 | Staskus et al. | |
| 5,930,279 | A | 7/1999 | Apollonov et al. | 372/50 |
| 5,987,045 | A | 11/1999 | Albares | 372/38 |
| 6,031,285 | A | 2/2000 | Nishibayashi | |
| 6,101,208 | A | 8/2000 | Gokay | |
| 6,147,365 | A | 11/2000 | Fischer et al. | |
| 6,208,677 | B1 | 3/2001 | Moyer | 372/66 |
| 6,252,179 | B1 | 6/2001 | Lauffer | 174/255 |
| 6,281,471 | B1 | 8/2001 | Smart | 219/121.62 |
| 6,295,307 | B1 | 9/2001 | Hoden et al. | 372/36 |
| 6,352,873 | B1 | 3/2002 | Hoden | 438/28 |
| 6,396,857 | B1 | 5/2002 | Labranche | |
| 6,424,667 | B1 | 7/2002 | Endriz et al. | |
| 6,480,514 | B1 | 11/2002 | Lorenzen et al. | 372/35 |
| 6,493,373 | B1 | 12/2002 | Boucart | 257/33.069 |
| 6,535,533 | B2 | 3/2003 | Lorenzen et al. | 372/34 |
| 6,535,541 | B1 | 3/2003 | Boucart et al. | 372/96 |
| 6,542,531 | B2 | 4/2003 | Sirbu | B82Y 20/00 |
| 6,727,117 | B1 | 4/2004 | McCoy | |
| 6,865,200 | B2 | 3/2005 | Takigawa et al. | |
| 7,016,383 | B2 | 3/2006 | Rice | |
| 7,286,359 | B2 | 10/2007 | Khbeis et al. | |
| 7,359,413 | B2 | 4/2008 | Tzuk et al. | 372/34 |
| 7,529,286 | B2 | 5/2009 | Gokay et al. | 372/69 |
| 7,660,335 | B2 | 2/2010 | Thiagarajan et al. | 372/34 |
| 7,864,825 | B2 | 1/2011 | Thiagarajan et al. | 372/36 |
| 7,944,955 | B2 | 5/2011 | Thiagarajan et al. | 372/34 |
| 8,017,935 | B2 | 9/2011 | Staszewski et al. | 257/27 |
| 8,653,550 | B2 | 2/2014 | Mastro | H01L 33/40 |
| 8,664,524 | B2 | 3/2014 | Garnett | H01L 31/02966 |
| 8,848,753 | B2 | 9/2014 | Koenning | 372/29.021 |
| 10,120,149 | B1 | 11/2018 | Mathai | G02B 6/425 |
| 11,406,004 | B2 | 8/2022 | Ruben et al. | H05K 1/02 |
| 2001/0017870 | A1 | 8/2001 | Hayakawa | 372/40 |
| 2002/0001864 | A1 | 1/2002 | Ishikawa et al. | |
| 2002/0009106 | A1 | 1/2002 | Miyokawa et al. | |
| 2002/0014631 | A1 | 2/2002 | Iwata | 257/89 |
| 2002/0025096 | A1 | 2/2002 | Wang et al. | 385/8 |
| 2002/0086483 | A1 | 7/2002 | Kim | 438/264 |
| 2002/0086486 | A1 | 7/2002 | Tanaka | H01L 21/28518 |
| 2002/0172244 | A1 | 11/2002 | Li et al. | |
| 2002/0181523 | A1 | 12/2002 | Pinneo et al. | 372/43 |
| 2003/0116767 | A1 | 6/2003 | Kneissl et al. | 257/79 |
| 2004/0037340 | A1 | 2/2004 | Yanagisawa | |
| 2004/0052280 | A1 | 3/2004 | Rice | |
| 2004/0082112 | A1 | 4/2004 | Stephens | |
| 2004/0125459 | A1 | 7/2004 | Tanitsu et al. | 359/619 |
| 2004/0258124 | A1 | 12/2004 | Lissotschenko | 372/75 |
| 2004/0264521 | A1 | 12/2004 | Ness et al. | |
| 2005/0087849 | A1 | 4/2005 | Morita et al. | 257/678 |
| 2005/0095755 | A1 | 5/2005 | Nakata et al. | |
| 2005/0232628 | A1 | 10/2005 | Von Freyhold et al. | 398/41 |
| 2005/0254539 | A1 | 11/2005 | Klimek | |
| 2005/0286231 | A1 | 12/2005 | Kishi | H05K 7/20 |
| 2006/0011938 | A1 | 1/2006 | Debray | 257/104 |
| 2006/0197100 | A1 | 9/2006 | Shen | 257/94 |
| 2007/0116079 | A1 | 5/2007 | Giniunas et al. | 372/69 |
| 2007/0273957 | A1 | 11/2007 | Zalevsky | G02B 27/1093 |
| 2008/0089380 | A1 | 4/2008 | Konig et al. | 372/75 |
| 2008/0123710 | A1 | 5/2008 | Brick | B82Y 20/00 |
| 2008/0130223 | A1 | 6/2008 | Nakamura | H02M 7/003 |
| 2008/0213710 | A1 | 9/2008 | Schultz | F23N 1/027 |
| 2008/0259983 | A1 | 10/2008 | Trococoli | 372/6 |
| 2009/0015185 | A1 | 1/2009 | Yoshida | 318/504 |
| 2009/0016398 | A1 | 1/2009 | Lorenzen et al. | 372/50.12 |
| 2009/0090932 | A1 | 4/2009 | Bour et al. | 257/103 |
| 2009/0251697 | A1 | 10/2009 | Cutillas et al. | 356/400 |
| 2010/0012188 | A1 | 1/2010 | Garnett | 136/260 |
| 2011/0051759 | A1 | 3/2011 | Telford | 372/35 |
| 2011/0103409 | A1 | 5/2011 | Sipes | G02B 6/4296 |
| 2011/0241549 | A1 | 10/2011 | Wootton | 315/117 |
| 2011/0280269 | A1 | 11/2011 | Ghang-Hasnain | H01S 5/105 |
| 2012/0043875 | A1 | 2/2012 | Seo | H01L 23/3677 |
| 2012/0114001 | A1 | 5/2012 | Fang et al. | 372/45.01 |
| 2012/0138266 | A1 | 6/2012 | Yamada et al. | F28D 15/00 |
| 2012/0153254 | A1 | 6/2012 | Mastro | 257/13 |
| 2012/0177074 | A1* | 7/2012 | Liu | H01S 5/0235 |
| | | | | 165/185 |
| 2012/0252144 | A1 | 10/2012 | Schroeder et al. | 438/26 |
| 2012/0287958 | A1 | 11/2012 | Lell | H01S 5/323 |
| 2013/0016752 | A1 | 1/2013 | Lell | H01S 5/323 |
| 2013/0259074 | A1 | 10/2013 | Newman | H01S 5/04 |
| 2013/0271959 | A1 | 10/2013 | Woodgate | G09F 13/04 |
| 2014/0014313 | A1 | 1/2014 | Hong et al. | F28F 27/00 |
| 2014/0084452 | A1 | 3/2014 | Nagamatsu | H01L 21/561 |
| 2014/0293554 | A1 | 10/2014 | Shashkov | 361/748 |
| 2015/0063341 | A1 | 3/2015 | Joseph et al. | H01S 5/02438 |
| 2015/0115288 | A1 | 4/2015 | Tamada et al. | |
| 2015/0162478 | A1 | 6/2015 | Fafard | 257/461 |
| 2015/0207011 | A1 | 7/2015 | Garnett | H01L 31/0368 |
| 2015/0207294 | A1 | 7/2015 | Brick et al. | H01S 5/10 |
| 2015/0255960 | A1 | 9/2015 | Kanskar | H01S 5/4075 |
| 2016/0014878 | A1 | 1/2016 | Kilhenny | 257/99 |
| 2016/0192473 | A1 | 6/2016 | Kasashima | 174/251 |

(56) References Cited

U.S. PATENT DOCUMENTS

| | | | |
|---|---|---|---|
| 2016/0366757 A1 | 12/2016 | Kobayashi | H05K 1/0204 |
| 2017/0051884 A1 | 2/2017 | Raring | |
| 2017/0288367 A1 | 10/2017 | Taniguchi | |
| 2017/0338194 A1 | 11/2017 | Gittemeier | |
| 2017/0346255 A1 | 11/2017 | Liang et al. | |
| 2018/0152000 A1 | 5/2018 | Crawford et al. | H01S 5/02288 |
| 2018/0254606 A1 | 9/2018 | McElhinney et al. | |
| | | | H01S 5/02484 |
| 2018/0261975 A1 | 9/2018 | Pavlov | |
| 2018/0278012 A1 | 9/2018 | Morita et al. | |
| 2018/0335582 A1 | 11/2018 | Ishige | |
| 2018/0337513 A1 | 11/2018 | Crawford et al. | H01S 5/3095 |
| 2020/0027839 A1 | 1/2020 | Hino | H01L 23/49 |
| 2020/0059067 A1* | 2/2020 | Helmrich | H01S 5/4025 |
| 2020/0075529 A1 | 3/2020 | Otsuka | |
| 2022/0123527 A1 | 4/2022 | Danziger et al. | |

FOREIGN PATENT DOCUMENTS

| | | | |
|---|---|---|---|
| DE | 968430 | 2/1958 | |
| DE | 19518177 | 11/1996 | H01S 3/0941 |
| DE | 10062579 | 6/2001 | |
| DE | 10258745 | 7/2004 | H01S 5/022 |
| DE | 102008040374 | 1/2010 | H01S 5/40 |
| EP | 1439618 | 7/2004 | H01S 5/024 |
| EP | 1452614 | 9/2004 | H01S 5/024 |
| EP | 1811617 | 7/2007 | H01S 5/024 |
| EP | 1887666 | 2/2008 | H01S 5/024 |
| EP | 2110903 | 10/2009 | H01S 5/00 |
| EP | 2305400 | 4/2011 | B22D 19/00 |
| JP | 2002111058 | 4/2002 | H01L 33/00 |

OTHER PUBLICATIONS

European Official Action issued in application No. 18173282.7, dated Jun. 7, 2024 (8 pgs).

Crawford, et al., "Advancements of Ultra-High Peak Power Laser Diode Arrays", Proc. Of SPIE, vol. 10514, 2018, 10 pages.

European Search Report issued in related European Patent Application 23159052.2, dated Jul. 14, 2023, 14 pages.

Feng, et al., "High efficient GaN-based laser diodes with tunnel junction", Applied Physics Letters 103, AIP Publishing, LLC, 2013.

Israeli Official Action issued in Application No. 266697, dated Oct. 9, 2022, 4 pages.

Rieprich, et al., "Proceedings of SPIE—Assessment of factors regulating the thermal lens profile and lateral brightness in high power diode lasers", SPIEL ASE, 2017.

Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).

Martin et al., "Thermal Behavior of Visible AlGaInP-GaInP Ridge Laser Diodes" IEEE Journal of Quantum Electronics, vol. 28, No. 11, dated Nov. 1992 (7 pgs).

Monachon , C., "Thermal Boundary Conductance Between Metals and Dielectrics" thesis for the graduation of Doctor of Science, Federal Institute of Technology in Lausanne, 2013 (251 pgs).

Nekorkin et al., "Nonlinear mode mixing in dual-wavelength semiconductor lasers with tunnel junctions", Applied Physics Letters 90, 171106 (2007) (3 pgs).

Notice of Allowance issued in U.S. Appl. No. 15/601,820, dated Jun. 11, 2019 (8 pgs).

Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).

Zhang et al., "Thermal Transport Across Metal-Insulator Interface Via Electron-Phonon Interaction," Journal of Physics Condensed Matter, dated Oct. 2013 (15 pgs).

Yonkee, B.P., et al., "Demonstration of a III-nitride edge-emitting laser diode utilizing a GaN tunnel junction contact", Optics Express, vol. 24, No. 7, pp. 7816-7822, Apr. 2016.

Young, Lee W., Authorized officer, International Searching Authority, Written Opinion of the International Searching Authority, International Patent Application Serial No. PCT/US06/47448, completion date: Oct. 30, 2008.

Young, Lee W., Authorized officer, International Searching Authority, International Search Report, International Patent Application Serial No. PCT/US06/47448, search date: Nov. 1, 2008.

Polyimide properties data sheet, www.mit.edu, Oct. 27, 2004 (Year 2004).

RO30000 Series Laminates, Rogers Corporation Data sheet (year 2020).

Sunstone, FR-4 PCB Material, Mar. 14, 2017 (Year 2017).

Chen et al., High-T Polymer Dec. 25, 2017 (Year 2017).

Robin K. Huang, Bien Chann, James Burgess, Michael Kaiman, Robert Overman, John D. Glenn, and Parviz Tayebati "Direct diode lasers with comparable beam quality to fiber, CO2, and solid state lasers", Proc. SPIE 8241, High-Power Diode Laser Technology and Applications X, 824102 (Feb. 8, 2012); https://doi.org/10.1117/12.907161 (abstract only).

* cited by examiner

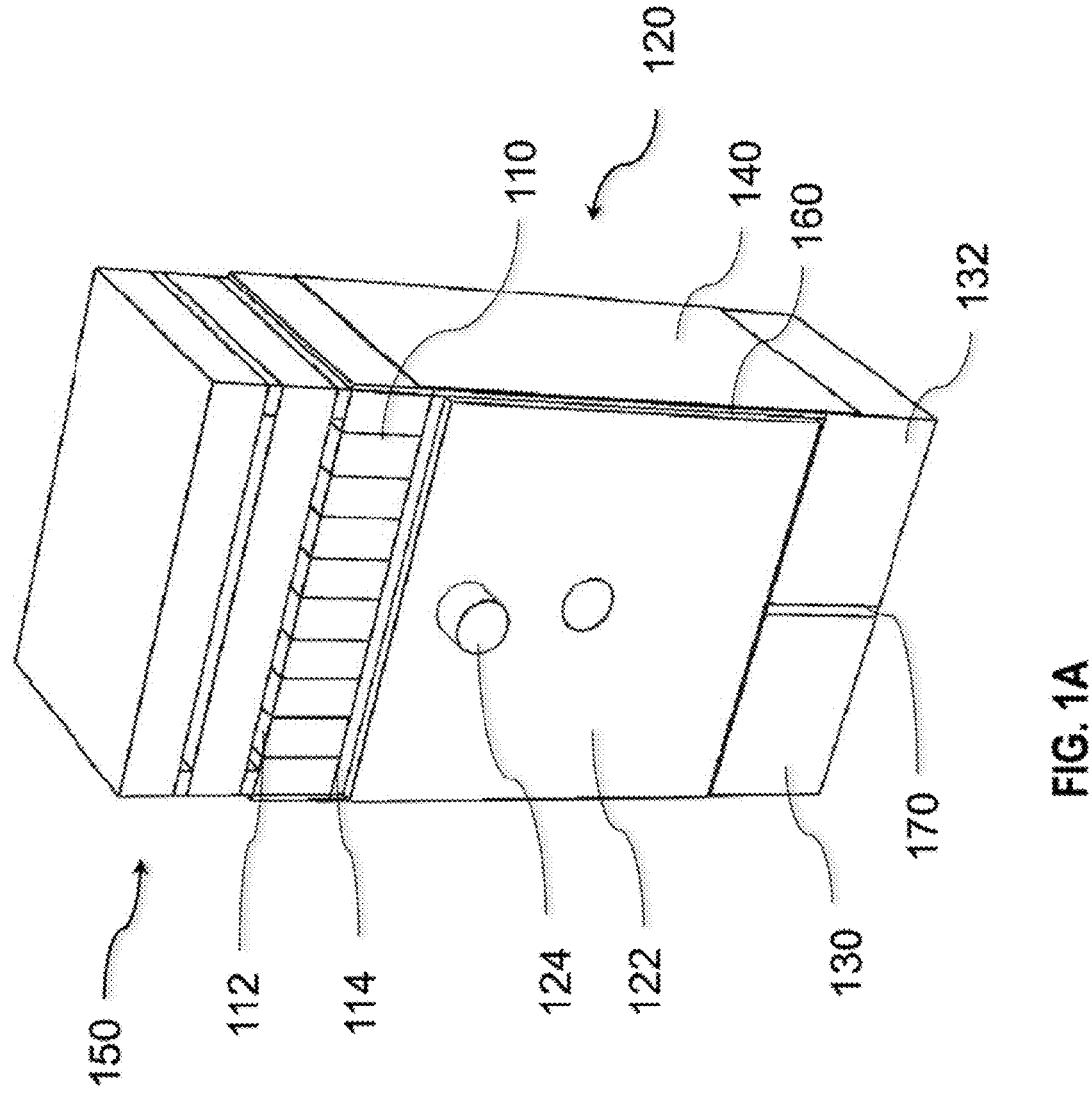
FIG. 1A

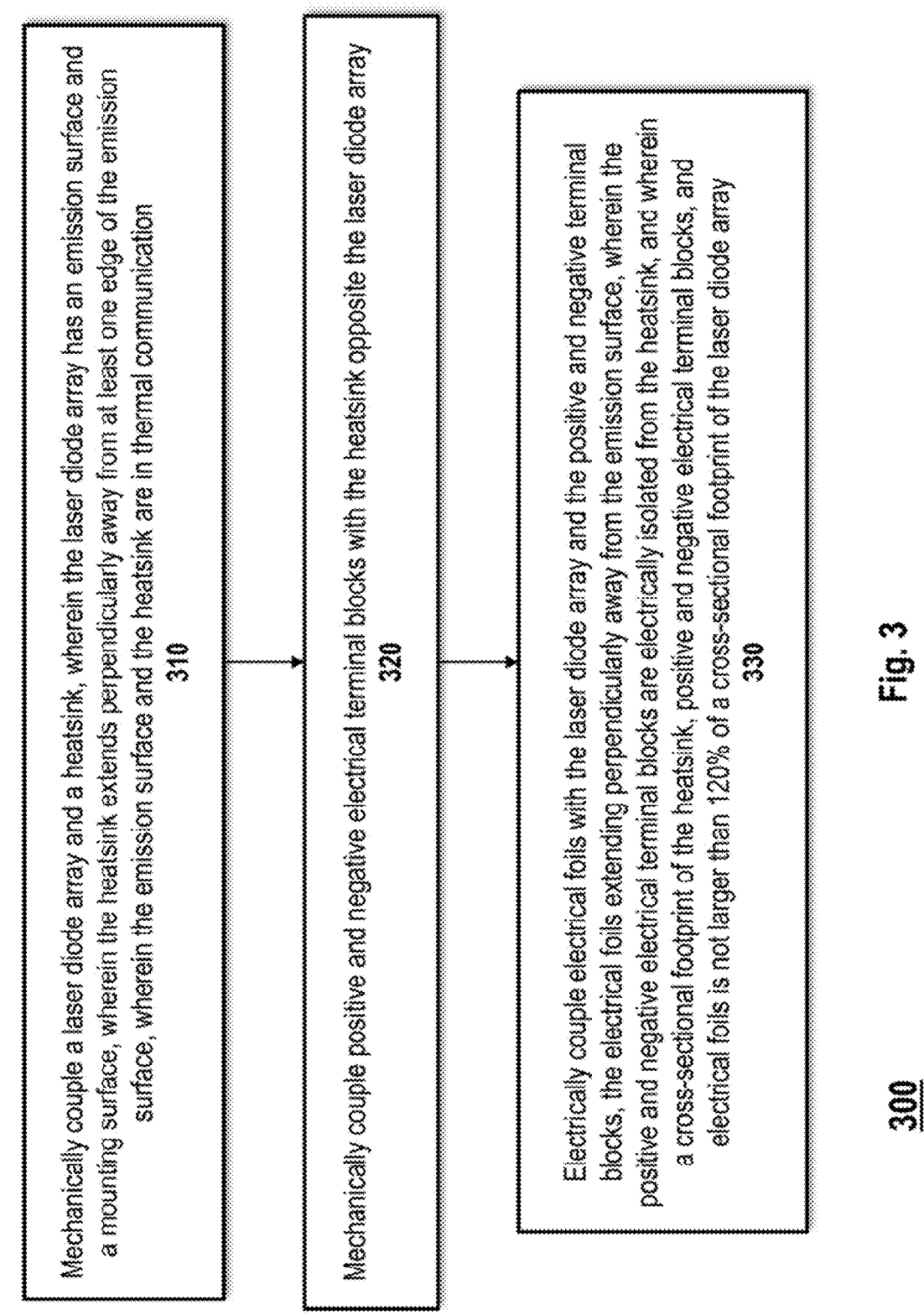

Method of Manufacturing a Laser Diode Assembly

Mechanically couple a laser diode array and a heatsink, wherein the laser diode array has an emission surface and a mounting surface, wherein the heatsink extends perpendicularly away from at least one edge of the emission surface, wherein the emission surface and the heatsink are in thermal communication
310

Mechanically couple positive and negative electrical terminal blocks with the heatsink opposite the laser diode array
320

Electrically couple electrical foils with the laser diode array and the positive and negative terminal blocks, the electrical foils extending perpendicularly away from the emission surface, wherein the positive and negative electrical terminal blocks are electrically isolated from the heatsink, and wherein a cross-sectional footprint of the heatsink, positive and negative electrical terminal blocks, and electrical foils is not larger than 120% of a cross-sectional footprint of the laser diode array
330

Method of Attaching Optical Components to a Laser Diode Array

Flow solder along at least a portion of at least one optical component
610

Position the at least one optical component on the laser diode array
620

Attach adjacent portions of the at least one optical component and the laser diode array by at least one from the set of: soldering and welding
630

600

HIGH PEAK POWER LASER DIODE ASSEMBLY

CROSS REFERENCE TO RELATED APPLICATION

This application claims benefit to U.S. Provisional patent Application Ser. No. 63/315,497, filed Mar. 1, 2022, the contents of which are incorporated herein by reference.

FIELD OF THE DISCLOSURE

The present disclosure is generally related to laser diode arrays and more particularly is related to high peak power laser diode array assemblies.

BACKGROUND OF THE DISCLOSURE

Laser diode arrays typically include multi laser diode bars of several emitters operating to produce one or more high-powered beams. Due to the high energy involved in the operation of these arrays, waste heat is generated during the emission process. It is known to provide heatsink elements to disperse waste heat away from the laser diode assembly. The maximum output power of each laser diode array is limited by the ability of the heatsinks to transport the heat away from the laser diode bars. To scale the output power multiple laser diode arrays are required in a close packed arrangement. However, current heatsink design, electrical connections, and mounting features make the laser diode arrays bulky and expansive. This limits the density of laser diode arrays that may be arranged together in a laser assembly, which in turn limits or controls the power, shape, and intensity of the resultant output beam or beams.

Thus, a heretofore unaddressed need exists in the industry to address the aforementioned deficiencies and inadequacies.

SUMMARY OF THE DISCLOSURE

Embodiments of the present disclosure provide a laser diode apparatus. Briefly described, in architecture, one embodiment of the apparatus, among others, can be implemented as follows. A laser diode apparatus includes a laser diode array having an emission surface and a mounting surface. A heatsink is in thermal communication with the laser diode array at the mounting surface. The heatsink extends perpendicularly away from at least one edge of the emission surface. Positive and negative electrical terminal blocks are in mechanical communication with the heatsink opposite the laser diode array. Electrical foils are in electrical communication with the laser diode array and the positive and negative terminals. The electrical foils extend perpendicularly away from the emission surface. The positive and negative electrical terminal blocks are electrically isolated from the heatsink. A cross-sectional footprint of the heatsink, positive and negative electrical terminal blocks, and electrical foils is not larger than 120% of a cross-sectional footprint of the laser diode array.

In one aspect of the apparatus, the laser diode array, positive and negative electrical terminal blocks, and electrical foils are soldered to the heatsink.

In another aspect of the apparatus, an optical assembly is located on the laser diode array within an emission path of the laser diode array. In a particular aspect, the optical assembly does not extend beyond the cross-sectional footprint of the laser diode array. In another particular aspect, each optical component of the optical assembly is soldered to each adjacent optical component, and the optical assembly is soldered to the laser diode array. In another particular aspect, each optical component of the optical assembly is welded to each adjacent optical component, and the optical assembly is welded to the laser diode array.

In another aspect of the apparatus, the positive and negative electrical terminal blocks are oriented in the same direction.

In another aspect of the apparatus, the electrical foils are located adjacent to the heatsink.

In another aspect of the apparatus, the electrical foils are connected to the laser diode array at opposite edges of the laser diode array.

The present disclosure can also be viewed as providing methods of manufacturing a laser diode assembly. In this regard, one embodiment of such a method, among others, can be broadly summarized by the following steps: mechanically coupling a laser diode array and a heatsink, wherein the laser diode array has an emission surface and a mounting surface, wherein the heatsink extends perpendicularly away from at least one edge of the emission surface, wherein the emission surface and the heatsink are in thermal communication; mechanically coupling positive and negative electrical terminal blocks with the heatsink opposite the laser diode array; and electrically coupling electrical foils with the laser diode array and the positive and negative terminals, the electrical foils extending perpendicularly away from the emission surface, wherein the positive and negative electrical terminal blocks are electrically isolated from the heatsink, and wherein a cross-sectional footprint of the heatsink, positive and negative electrical terminal blocks, and electrical foils is not larger than 120% of a cross-sectional footprint of the laser diode array.

In one aspect of the method, the laser diode array, positive and negative electrical terminal blocks, and electrical foils are soldered to the heatsink block.

In another aspect of the method, an optical assembly is mechanically coupled on the laser diode array within an emission path of the laser diode array. In a particular aspect, the optical assembly does not extend beyond the cross-sectional footprint of the laser diode array. In another particular aspect, each optical component of the optical assembly is soldered to each adjacent optical component, and the optical assembly is soldered to the laser diode array. In another particular aspect, each optical component of the optical assembly is welded to each adjacent optical component, and the optical assembly is welded to the laser diode array.

In another aspect of the method, the electrical foils are located adjacent to the heatsink.

The present disclosure can also be viewed as providing methods of attaching optical components to a laser diode array. In this regard, one embodiment of such a method, among others, can be broadly summarized by the following steps: flowing solder along at least a portion of at least one optical component; positioning the at least one optical component on the laser diode array; and attaching adjacent portions of the at least one optical component and the laser diode array by at least one from the set of: soldering and welding.

In one aspect of the method, at least one optical component is positioned within a cross-sectional footprint of the laser diode array.

In another aspect of the method, a plurality of optical components is positioned one on top of another and within a cross-sectional footprint of the laser diode array.

In another aspect of the method, the at least one optical component comprises at least one pedestal extending from a surface of the optical component, and the solder is flowed along the at least one pedestal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1A is a perspective illustration of a laser diode apparatus, in accordance with a first exemplary embodiment of the present disclosure.

FIG. 3 is a flowchart illustrating a method of manufacturing a laser diode assembly, in accordance with the first exemplary embodiment of the present disclosure.

DETAILED DESCRIPTION

Figure 1B:
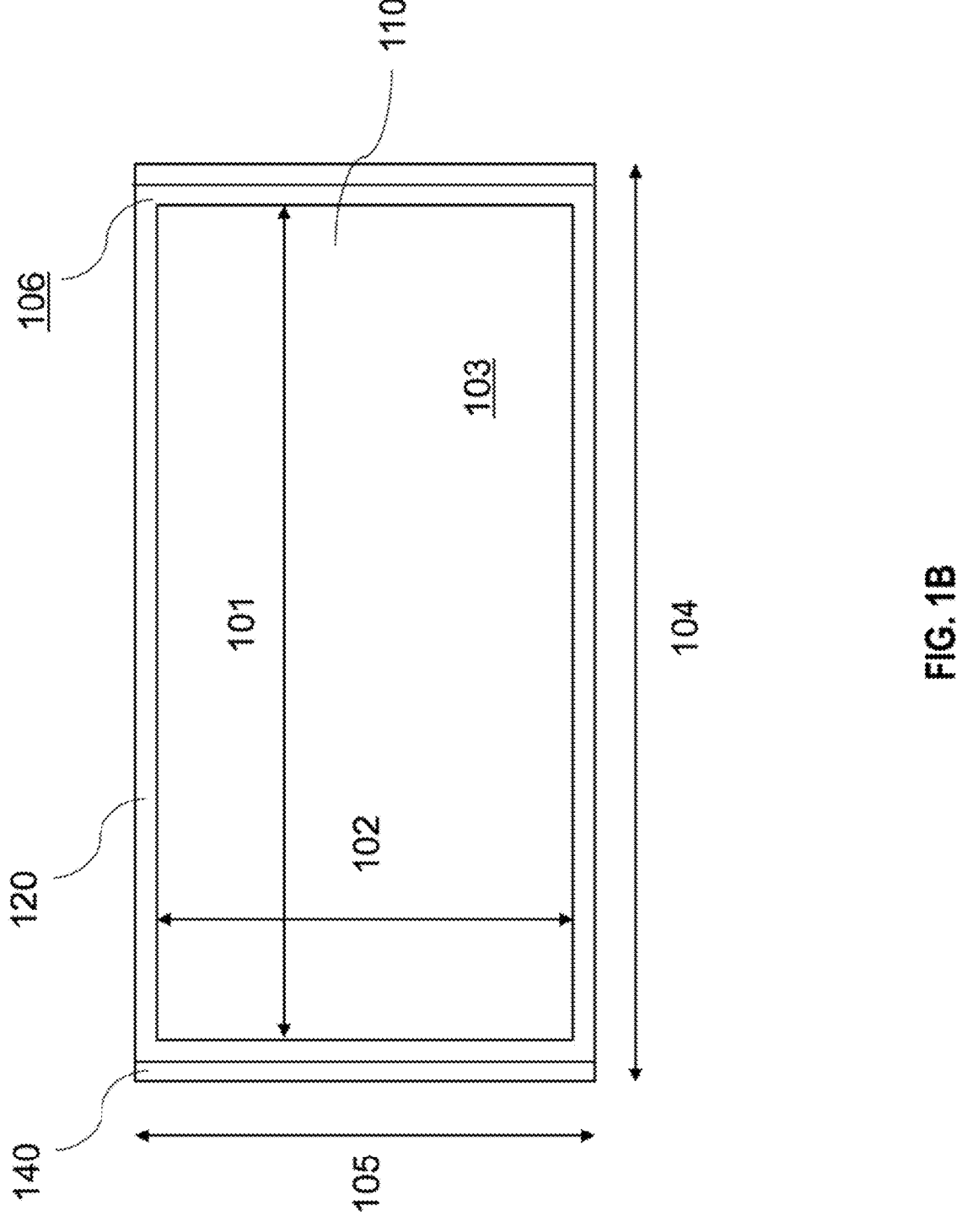
FIG. 1B is an overhead view diagrammatic illustration of the laser diode apparatus of FIG. 1A, in accordance with the first exemplary embodiment of the present disclosure.

FIG. 1A is a perspective illustration of a laser diode apparatus, 100 in accordance with a first exemplary embodiment of the present disclosure. The laser diode apparatus (hereinafter "apparatus") 100 includes a laser diode array 110 having an emission surface 112 and a mounting surface 114. A heatsink 120 is in thermal communication with the laser diode array 110 at the mounting surface 114. The heatsink 120 extends perpendicularly away from at least one edge of the emission surface 112. Positive and negative electrical terminal blocks 130, 132 are in mechanical communication with the heatsink 120 opposite the laser diode array 110. Electrical foils 140 are in electrical communication with the laser diode array 110 and the positive and negative terminals 130, 132. The electrical foils 140 extend perpendicularly away from the emission surface 112. The positive and negative electrical terminal blocks 130, 132 are electrically isolated from the heatsink 120. A cross-sectional footprint of the heatsink 120, positive and negative electrical terminal blocks 130, 132, and electrical foils 140 is not larger than 120% of a cross-sectional footprint of the laser diode array 110.

The laser diode array 110 may be any suitable shape, size, arrangement, number, and orientation of laser diodes. The laser diode array 110 may operate in or with any desired wavelength, pulse length, and power. The laser diode array 110 may have an emission surface 112, which may be a plane or surface area from which laser light is emitted. In one example, the emission surface 112 may be oriented at a top portion of the laser diode array 110, and the emitted light may propagate out from the top and generally above the laser diode array 110. In one example, an optical assembly 150 may be located within the path of the emitted light. The optical assembly 150 may include any suitable optical components for guiding, shaping, collimating, homogenizing, or otherwise directing the emitted light. In the example shown in FIG. 1A, the optical assembly 150 is located on top of the laser diode array 110. Light may be emitted from the emission surface 112 and through the optical assembly 150 upwards along the page, as shown in FIG. 1A. The optical assembly 150 may be affixed to the laser diode array 110. In one example, the optical assembly 150 may be affixed by epoxy, glue, or other chemical adhesive. In another example, the optical assembly 150 may be affixed by solder or welding. This is described in greater detail in FIGS. 4-5, below.

The laser diode array 110 may include a mounting surface 114. In one example, the mounting surface 114 may be substantially opposite the emission surface 112, depending on the manufacture and orientation of the laser diodes within the array. In the example shown in FIG. 1A, the mounting surface 114 is substantially opposite the emission surface 112 on the top of the laser diode array 110, i.e., is located on a bottom portion of the laser diode array 110. The mounting surface 114 may be a plane or surface area of the laser diode array to which other components and structural elements may be mounted.

A heatsink 120 is in thermal communication with the laser diode array 110 at the mounting surface 114. The heatsink 120 may be any suitable size, thickness, shape, and material compilation. In one example, the heatsink 120 may be a copper thermal reservoir affixed to the laser diode array 110 at the mounting surface 114. The heatsink 120 may include a heatsink block 122. In one example, the heatsink block 122 may be a solid piece having a cross-sectional area approximately the same as the laser diode array 110. In another example, the heatsink block 122 may be a solid piece having a cross-sectional area less than or slightly larger than that of the laser diode array. In another example, the heatsink block 122 may include fins, grooves, or other shapes that increase the surface area of the heatsink 120 to provide increased cooling. The heatsink block 122 may extend away from the laser diode array 110 to draw heat away from the laser diode array 110. In one example, the extension may be perpendicular to the emission surface 112 and along at least one edge of the mounting surface 114.

The heatsink 120 may include at least one locating pin 124 extending away from the heatsink block 122. The locating pins 124 may be used to mount the apparatus 100 on a substrate, such as a plate, housing, or other surface for integration with additional components.

Positive and negative electrical terminal blocks 130, 132, respectively are in mechanical communication with the heatsink 120 opposite the laser diode array 110. The electrical terminal blocks 130, 132 may be affixed to the heatsink 120 at a lower end of the heatsink block 122. In one example, the electrical terminal blocks 130, 132 may be located on a bottom side of the heatsink block 122. The electrical terminal blocks 130, 132 may allow for electrical power to be applied to the laser diode array 110. In one example, the electrical terminal blocks 130, 132 may face the same direction. The electrical terminal blocks may be electrically isolated from the heatsink using electrically isolating material 170. The electrically isolating material 170 may include any suitable non-conductive, insulating material, including ceramics, isolating plastics, rubber, and the like. The electrically isolating material 170 may be affixed to the electrical terminal blocks 130, 132 and the heatsink 120 by adhesive, epoxy, solder, or any other suitable means. In one example, the electrical terminal blocks 130, 132, the electrically isolating material 170, and the heatsink block 122 may all be soldered together to form a monolithic sub assembly.

Electrical foils 140 are in electrical communication with the laser diode array 110 and the positive and negative terminals 130, 132. The electrical foils 140 may extend perpendicularly away from the emission surface 112. In one example, the electrical foils 140 may extend below the emission surface 112 along the same axis as the heatsink 120. In one example, the electrical foils 140 may extend from opposing edges of the laser diode array 110. For instance, one electrical foil 140 may extend from one edge of the laser diode array 110, and may correspond to the positive electrical terminal 130, as shown in FIG. 1A. A second electrical foil 140 (not visible in this view) may extend from an opposite edge of the laser diode array 110, and may correspond to the negative electrical terminal 132. The heatsink 120 may be located between the electrical foils 140. In one example, the electrical foils 140 may be electrically isolated from the heatsink 120 using electrically isolating materials 160 to maintain isolation of the electrical components from the thermal components of the apparatus 100. The electrically isolating materials 160 may be any of the same materials described relative to the electrically isolating materials 170, above. In one example, the electrical foils 140 may be soldered to the laser diode array 110, the electrically isolating material 160, and the terminal blocks 130, 132. In another example, the electrical foils 140 may be welded to the laser diode array 110, the electrically isolating material 160, and the terminal blocks 130, 132. In another example, the electrical isolating material 160 is soldered to the heatsink 122. The electrically isolating material 160 may be a single piece or may be made from multiple pieces that are fixed to the heatsink 120.

The heatsink 120, positive and negative electrical terminal blocks 130, 132, and electrical foils 140 do not extend substantially beyond a cross-sectional footprint of the laser diode array 110. As shown in FIG. 1A, the cross-sectional footprint of the laser diode array 110 may be defined as the area within the horizontal plane through the emission surface 112 and/or the mounting surface 114. In one example, as assembled, the heatsink 120, positive and negative electrical terminal blocks 130, 132, and electrical foils 140 may all be located within the vertical space beneath that cross-sectional area such that the laser diode array 110 defines the maximum width and depth of the apparatus 100, while the remaining components define the vertical length of the apparatus 100, as shown in FIG. 1A. In one example, the heatsink 120, positive and negative electrical terminal blocks 130, 132, and electrical foils 140 may encompass about the same cross-sectional area as the laser diode array 110. In another example, those components may encompass a marginally larger cross-sectional area as much as 20% larger. In another example, the optical assembly 150 may not extend beyond the cross-sectional footprint of the laser diode array 110. In one example, the at least one locating pin 124 may extend beyond and outside of the cross-sectional area in a single direction to allow the apparatus 100 to be mounted.

FIG. 1B is an overhead view diagrammatic illustration of the laser diode apparatus 100 of FIG. 1A, in accordance with the first exemplary embodiment of the present disclosure. FIG. 1B shows how a cross-sectional footprint 103 of the laser diode array 110 may be determined and compared with a cross-sectional footprint 106 of the heatsink 120 and electrical foils 140. In one example, the cross-sectional footprint 103 of the laser diode array 110 may be determined by multiplying a width 101 by a length 102 of the laser diode array 110, said width and length 101, 102 determined from measurements along orthogonal axes. The cross-sectional footprint 106 of the heatsink 120 and electrical foils 140 may be determined by multiplying a width 104 by a length 105 of the heatsink 120 and electrical foils 140 when assembled together, said width and length 104, 105 determined from measurements along the same orthogonal axes as the width and length 101, 102 of the laser diode array 110. It should be understood that the cross-sectional footprint 106 may include any additional components described relative to FIG. 1A, above, including the electrically isolating material 160, 170 used to isolate electrical components in operation.

When compared, the cross-sectional footprint 106 of the heatsink 120 and electrical foils 140 may be no more than 120% the cross-sectional footprint 103 of the laser diode array 110, which is to say that the area occupied by the heatsink 120 and electrical foils 140, when measured in this manner, may be as much as 20% larger than the area of the laser diode array 110. In one example, the ratio of the cross-sectional footprints 106, 103 may be less than 120%. For instance, the ratio may be between 100% and 120%. It should be understood that the area occupied by the heatsink 120 and electrical foils 140 may be equal to, or minimally larger than the area occupied by the laser diode array 110.

Figure 2A:
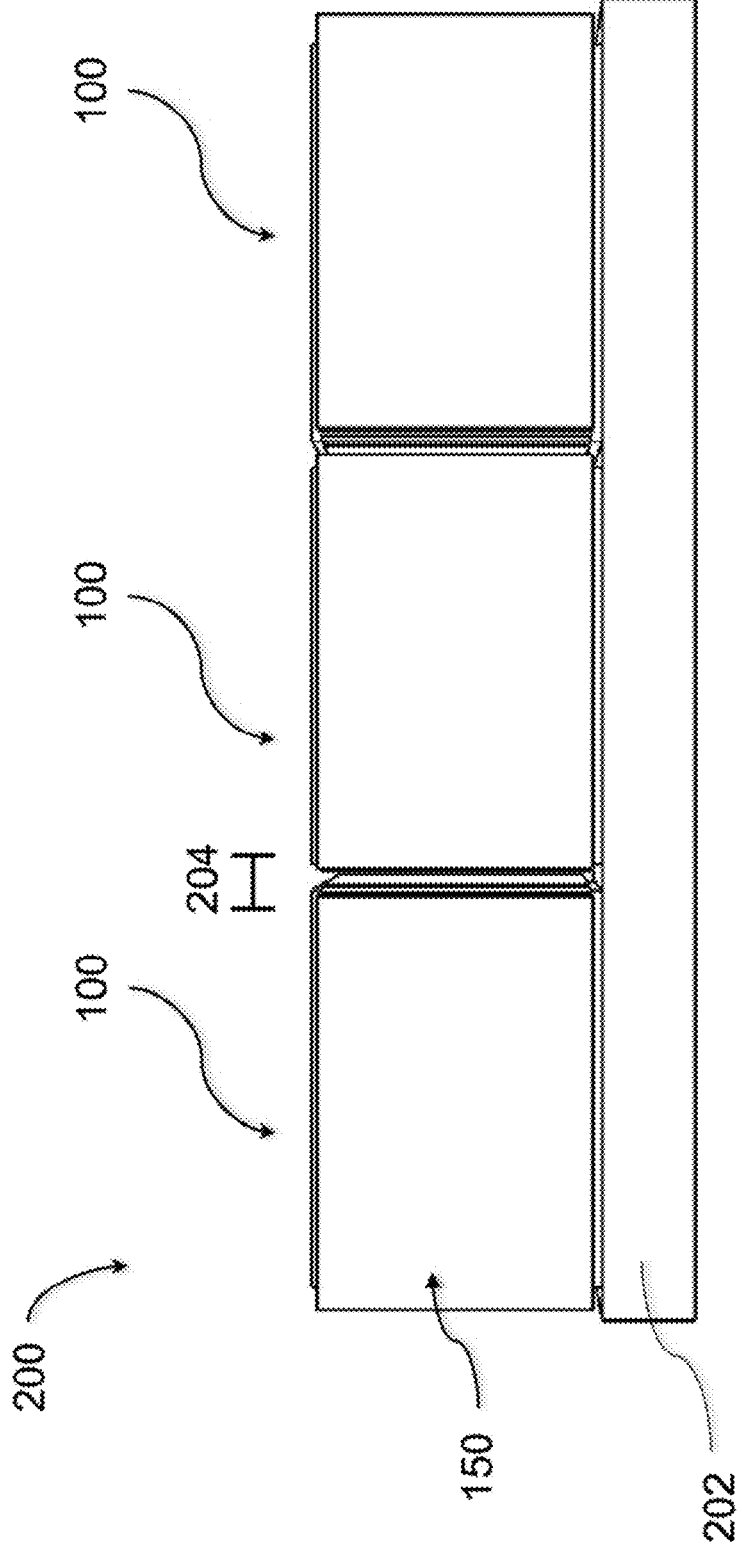
FIG. 2A is a diagrammatic illustration of an array of laser diode apparatuses, in accordance with the first exemplary embodiment of the present disclosure.

FIG. 2A is a diagrammatic illustration of an array 200 of laser diode apparatuses 100, in accordance with the first exemplary embodiment of the present disclosure. The laser diode apparatuses 100 may include all of the components described relative to FIG. 1A, above. In FIG. 2A, the apparatus 100 is shown oriented such that the optical assembly 150 and/or laser diode array 110 faces out of the page, and the emission direction of the laser diode array 110 would be straight out of the page. In this orientation, the remaining components of the apparatus 100 are located behind the optical assembly 150 and thus not visible in the figure. The locating pins 124 are not shown but are used to mount the apparatus 100 on a backplane 202. Reference characters indicating the locating pins 124 and optical assembly 150 are not labelled for every apparatus 100 for clarity of illustration. However, it should be understood that each apparatus 100 shown in FIG. 2A includes the optical assembly 150 and the locating pins 124.

As shown in FIG. 2A, the array 200 of laser diode apparatuses 100 may include a plurality of apparatuses 100 located on a backplane 202 in close proximity to one another. It should be understood that FIG. 2A is diagrammatic, and the proximity shown in the drawing is not to scale. In one example, each apparatus 100 may be located directly next to another apparatus 100 such that non-electrically conductive components, for example, the optical assemblies 150, are in contact. In another example, the distance 204 between adjacent apparatuses 100 may be less than 1 mm. In another example, the distance 204 between adjacent apparatuses 100 may include an insulating material to prevent communication between adjacent electrical components. This may allow a higher density of laser diodes within a given area.

It should be understood that the array 200 may include any number, size, configuration, and orientation of laser diode apparatuses 100. This may include one-dimensional arrays, as shown in FIG. 2A, two-dimensional arrays, as shown in FIG. 2B, comprising a plurality of rows and columns along the optical or emission axis.

Figure 2B:
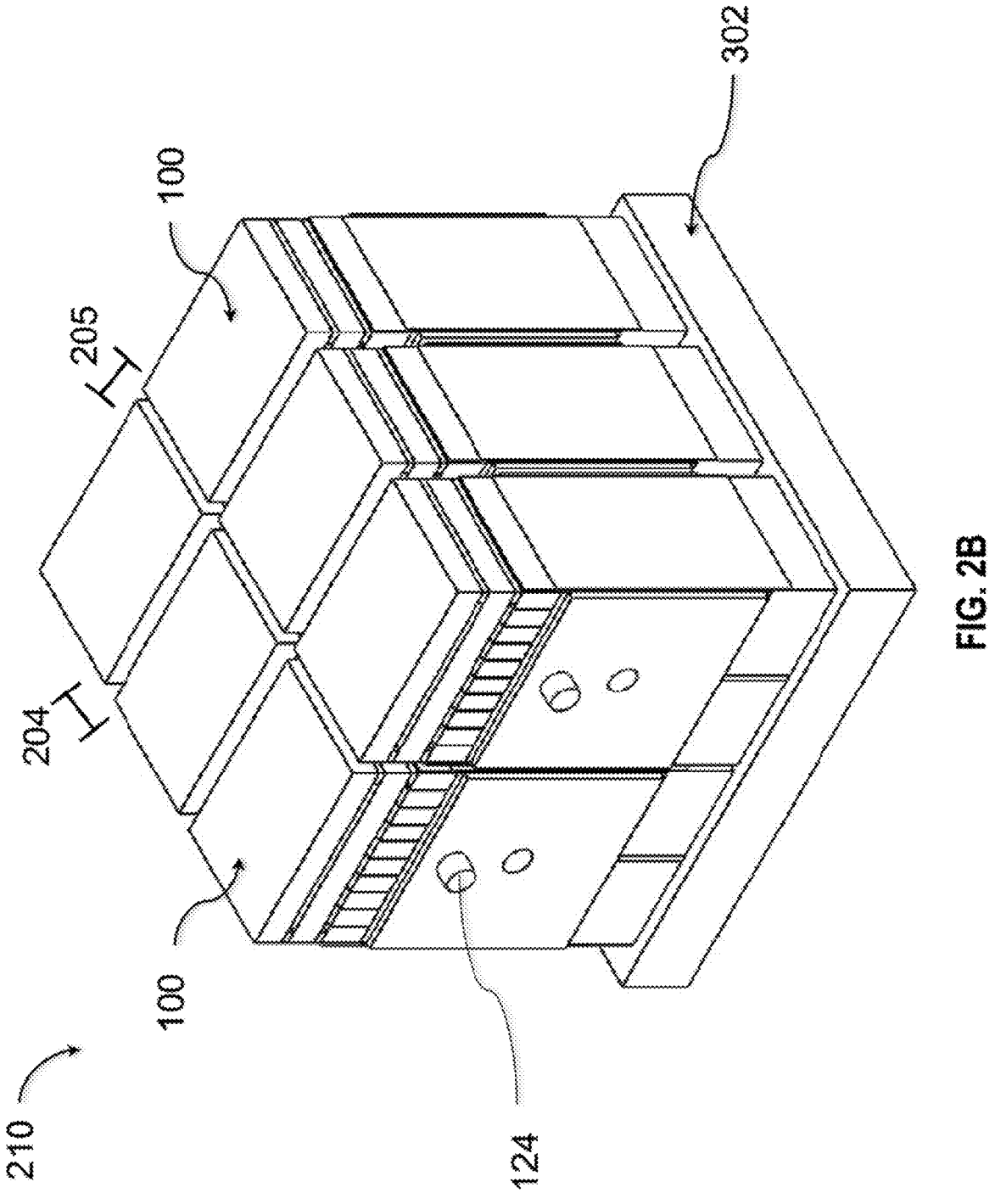
FIG. 2B is a diagrammatic illustration of a two-dimensional array of laser diode apparatuses, in accordance with the first exemplary embodiment of the present disclosure.

FIG. 2B is a diagrammatic illustration of a two-dimensional array 210 of laser diode apparatuses 100, in accordance with the first exemplary embodiment of the present disclosure. As shown in FIG. 2B, a plurality of apparatuses 100 including any of the components described relative to FIG. 1A, above, may be configured in close proximity to one another. The apparatuses 100 may be arranged into two columns, each column having a plurality of apparatuses 100 in adjacent rows. The apparatuses 100 may be configured such that the terminal blocks 130, 132 are used to mount the laser diode arrays 110 to an electrically insulating back plane assembly 302. Thus, the emission or propagation direction of light from the two-dimensional array 210 may be upward along the page and away from the back plane assembly 302. In one example, the at least one locating pin 124 may space the apparatuses 100 apart from one another. Thus, the distance 204 between adjacent apparatuses 100 in a first dimension may be determined by the length of the locating pins 124. In one example, the distance 205 between adjacent apparatuses 100 in the second dimension may be the same as the distance 204. In another example, the distances 204, 205 may be different. In one example, the apparatuses 100 may be oriented in the same direction, i.e., oriented to emit light along a common axis. In another example, the apparatuses 100 may be oriented in a plurality of directions, i.e., at different angles with respect to the optical or emission axis.

FIG. 3 is a flowchart 300 illustrating a method of manufacturing a laser diode assembly, in accordance with the first exemplary embodiment of the disclosure. It should be noted that any process descriptions or blocks in flow charts should be understood as representing modules, segments, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure. The method may include any features, components, or functions disclosed relative to any other figure of this disclosure.

Step 310 includes mechanically coupling a laser diode array and a heatsink, wherein the laser diode array has an emission surface and a mounting surface, wherein the heatsink extends perpendicularly away from at least one edge of the emission surface, wherein the emission surface and the heatsink are in thermal communication. In one example, the laser diode array may be soldered to the heatsink to form the mechanical coupling as well as thermal coupling. In another example, a plurality of locating pins may be located on the heatsink block and may extend outward from the heatsink.

Step 320 includes mechanically coupling positive and negative electrical terminal blocks with the heatsink opposite the laser diode array. The electrical terminal blocks may be soldered to the heatsink and may be electrically isolated from the heatsink. In one example, the electrical terminal blocks may be attached to the same face of the heatsink, and may be oriented to face the same direction.

Step 330 includes electrically coupling electrical foils with the laser diode array and the positive and negative terminal blocks, the electrical foils extending perpendicularly away from the emission surface, wherein the positive and negative electrical terminal blocks are electrically isolated from the heatsink, and wherein a cross-sectional footprint of the heatsink, positive and negative electrical terminal blocks, and electrical foils is not larger than 120% of a cross-sectional footprint of the laser diode array. In one example, the electrical foils may extend from the positive and negative electrical terminal blocks to the laser diode array along one or more sides of the heatsink. The electrical foils may be electrically isolated from one another.

Figure 4:
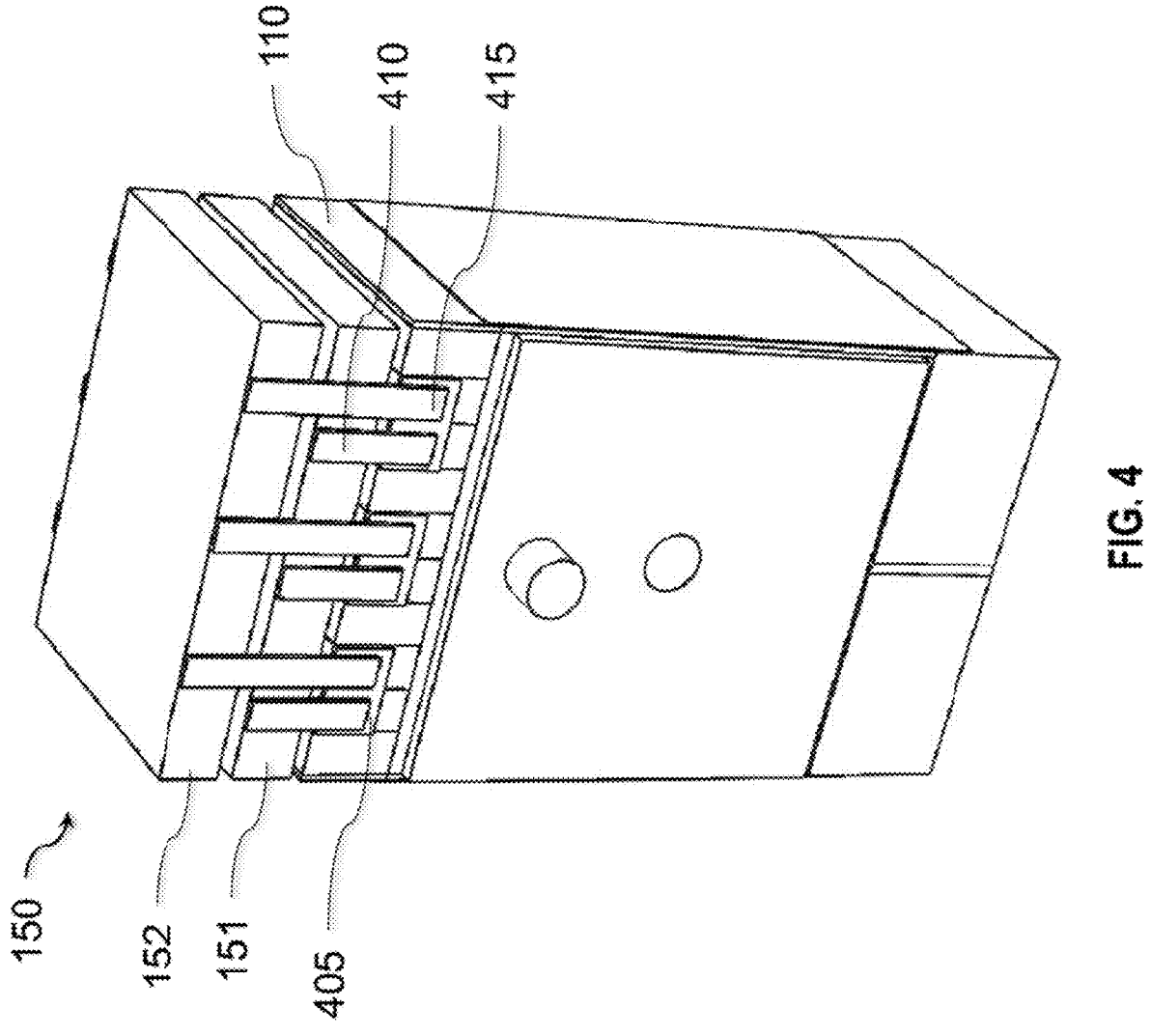
FIG. 4 is a diagrammatic illustration showing an assembly of optical components upon the laser diode apparatus, in accordance with the first exemplary embodiment of the present disclosure. In this illustration each optical element is mounted to the side of the laser diode array with pedestals.
Figure 5:
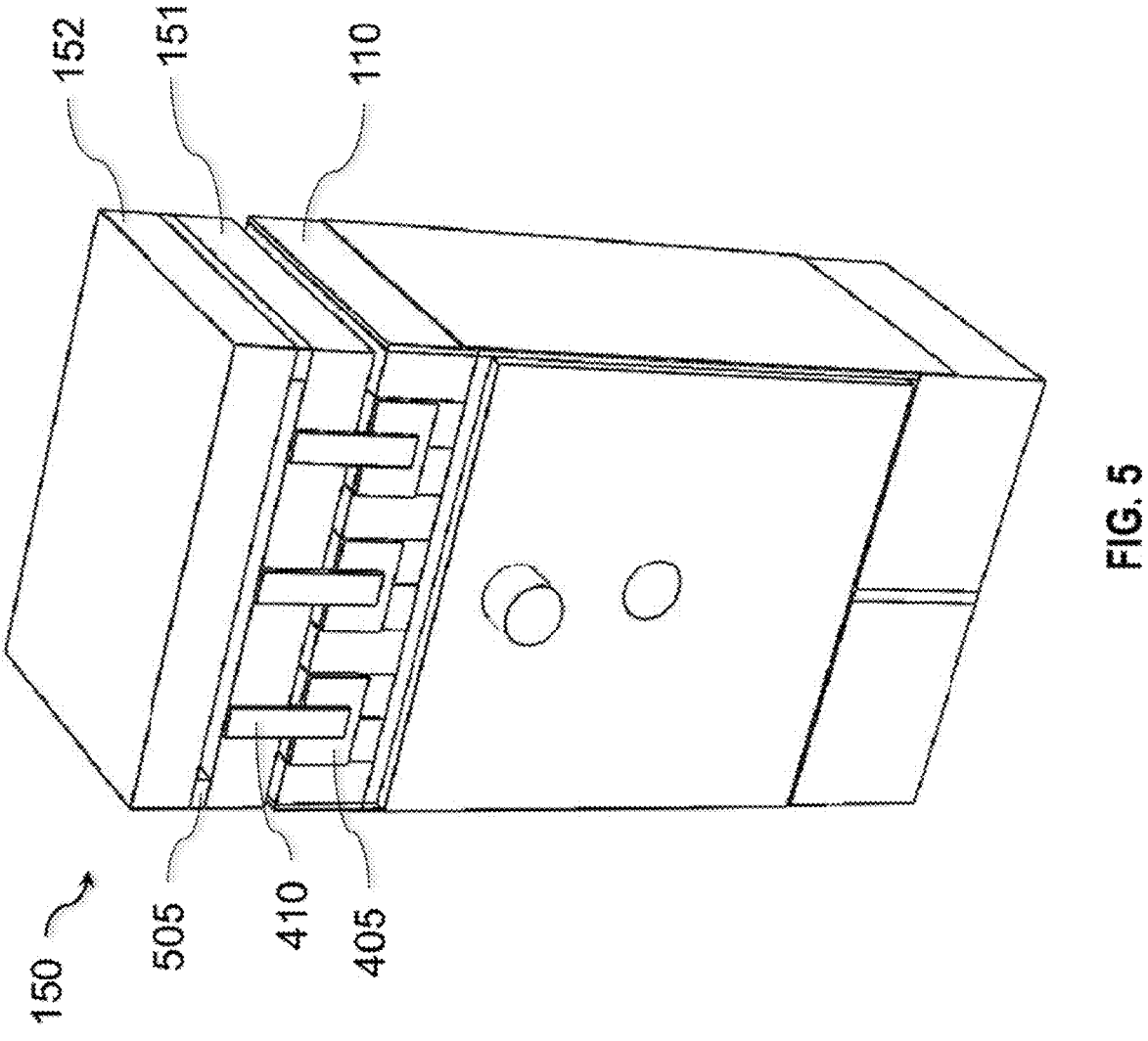
FIG. 5 is a diagrammatic illustration showing an assembly of optical components upon the laser diode apparatus, in accordance with the first exemplary embodiment of the present disclosure. In this illustration the first optical element is attached to the side of the laser diode array and consequent optical elements are attached to the previous optical element via spacer elements.

FIGS. 4-5 may be further understood with reference to FIGS. 1A-3, above. FIGS. 4-5 illustrate a view of optical components 151-152 that may be epoxied, soldered, or welded and used in operation with a laser diode array 110 to guide, shape, collimate, homogenize, or otherwise direct the emitted light.

FIG. 4 is a diagrammatic illustration showing an assembly of optical components ("optical assembly") 150 upon the laser diode apparatus 100, in accordance with the first exemplary embodiment of the present disclosure. An optical assembly 150 may include any suitable type, number, and arrangement of optical components, depending on the desired operation of the laser diode array 110. In the example shown in FIG. 4, the illustrated components are a collimating lens 151 and a beam shaper assembly 152. Any other combination, arrangement, or addition of components may be included within the scope of this disclosure.

In one example, the optical components 151,152 and one or more mounting tabs 410,415 may be soldered together using an amount of solder located between each component. The solder and the mounting tabs 410, 415 may be located along at least a portion of the component surfaces, for instance, along at least a portion of an outer face of the optical components 151-152. In one example, the solder and the mounting tabs 410, 415 may be located along a plurality of outer faces of the optical components 151-152. In another example, the solder and the mounting tabs may be located along an entire perimeter of one or more optical components 151-152. The solder may be any suitable type and amount of solder. In one example, this may include SnPb (63/37) solder in the form of a ball. In another example, this may include AuSn (80/20) in the form of a flat preform. Any suitable number, arrangement, and type of mounting tabs may be used. As an example, FIG. 4 illustrates mounting tabs 410, 415 placed at a plurality of locations along one or more outer faces of the optical components 151-152 and the laser diode array 110. In one example, the length of each mounting tab 410, 415 may correspond to a distance between the laser diode array 110 and the optical component 151, 152 to which it is attached. For example, a mounting tab 410 attached to an immediately adjacent optical component 151 may be shorter than a mounting tab 415 attached to a subsequent optical component 152. In one example, each mounting tab 410, 415 may attach only to a single optical component 151, 152 and the laser diode array 110. In another example, one or more mounting tabs 410, 415 may attach to multiple optical components 151, 152.

In one example, at least a portion of the surfaces of the optical components 151-152 may be plated with a gold compound on. The gold compound may include any suitable compound, for instance, AuSn (80/20). During assembly, the optical components 151, 152 and mounting tabs may be soldered together in an oven or epoxied together using a suitable glue. Mounting plates 405 may be soldered to the side of the laser diode array in an oven or epoxied using a suitable glue. The optical components 151-152 may then be assembled to the laser diode array 110 by attaching the mounting tabs 410,415 to the mounting plates 405. The attaching areas, for example, may be purged with forming gas, and a laser solder process may be used to flow the solder between the components 410,415, and 405 to attach the optical assembly 150 to the laser diode array 110. In another example, an epoxy process may be used to attach the mounting tabs 410, 415, to the mounting plates 405 using a suitable glue. In another example, a welding process may be used to attach the mounting tabs 410, 415, to the mounting plates 405.

The mounting tabs 410, 415, for example, may be formed from titanium, glass, glass with metal coatings, or ceramics with metal coatings. The mounting plates 405, for example, may be formed from glass, glass with metal coatings, or ceramics with metal coatings. For clarity of illustration, the mounting tabs 410-415 and mounting plates 405 are labelled only on the one side of the figure; however, it should be understood that each component 405,410, 415, may be included at other locations, including on the opposite side of the figure, as shown in FIG. 4

FIG. 5 is a diagrammatic illustration showing an assembly of optical components ("optical assembly") 150 upon the laser diode apparatus 100, in accordance with the first exemplary embodiment of the present disclosure. In the example shown in FIG. 5, the first layer of optical components 151 may be attached using the methods described relative to FIG. 4, above to the and the laser diode array 110 and the subsequent layers of optical components 152 are mounted using pedestals 505, to the previous layer of optical components 151. Any combination of mounting tabs 410 and pedestals 505 may be used within the scope of this disclosure.

During assembly, the pedestals 505, for example, may be soldered to the ends of the optical components 151, 152 in an oven. In another example the pedestals 505 may be epoxied to the optical components 151, 152 using a suitable glue. The pedestals 505, for example, may be formed from titanium or glass or glass with metal coatings. For clarity of illustration, pedestals 505 are labelled only on the left side of the figure; however, it should be understood that each component 152, may include pedestals 505 at other locations, including on the left side of the figure, as shown in FIG. 5. Solder may be flowed over each pedestal 505 prior to attachment. The solder may include any suitable type and amount of solder, for example, AuSn (80/20). As described relative to FIG. 4, above, a gold compound may be used to plate at least a portion of the surfaces of components 152.

The optical components 151-152 may be assembled, one on top of another. As shown in FIG. 5, the pedestals 505 of successive components may be, for example, epoxied to optical component 151. In another example, the pedestals 505 of successive components may be soldered to optical component 151. In another example, the pedestals 505 of successive components may be welded to optical component 151.

Figure 6:
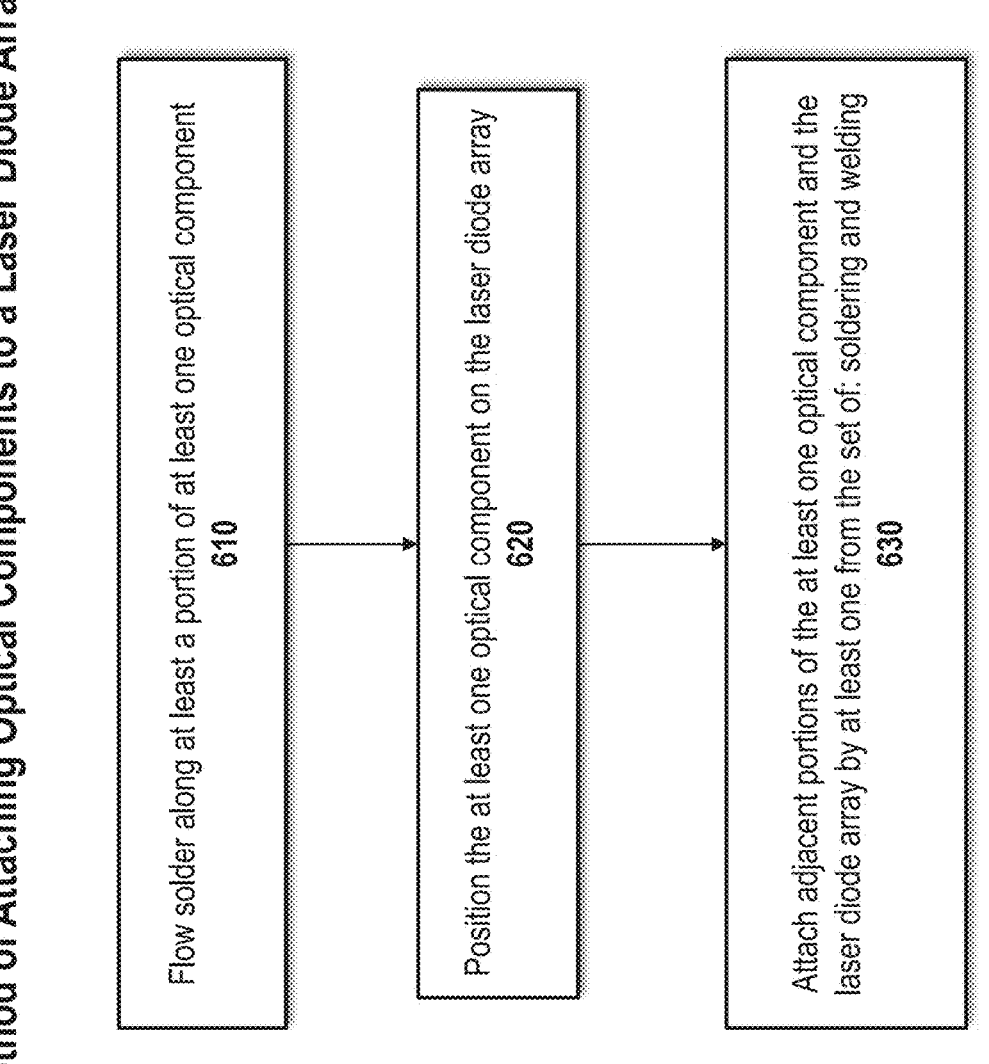
FIG. 6 is a flowchart illustrating a method of attaching optical components to a laser diode array, in accordance with the first exemplary embodiment of the present disclosure.

FIG. 6 is a flowchart 600 illustrating a method of attaching optical components to a laser diode array, in accordance with the first exemplary embodiment of the present disclosure. FIG. 6 may be better understood with reference to FIGS. 1-5, above, and may incorporate any components, processes, or other aspects of those figures therein.

Step 610 includes flowing solder along at least a portion of at least one optical component. In one example, the solder may be SnPb (63/37) or AuSn (80/20). In another example, the solder may be positioned as a ball. In another example, the solder may be flowed over at least one pedestal extending above or below a surface of an optical component.

Step 620 includes positioning the at least one optical component on the laser diode array. In one example, the at least one optical component may be positioned on the laser diode array within the emission path of a beam emitted by the laser diode array. In another example, the at least one optical component may be positioned to fit entirely within a cross-sectional footprint of the laser diode array. In another example, a plurality of optical components may be positioned, one on top of another, within the cross-sectional footprint of the laser diode array.

Step 630 includes attaching adjacent portions of the at least one optical component and the laser diode array by at least one from the set of: soldering and welding.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A laser diode apparatus, comprising:
   a laser diode array having an emission surface and a mounting surface, wherein at least one mounting plate is affixed to the mounting surface;
   a heatsink in thermal communication with the laser diode array at the mounting surface, the heatsink extending perpendicularly away from at least one edge of the emission surface;
   positive and negative electrical terminal blocks in mechanical communication with the heatsink opposite the laser diode array;
   electrical foils in electrical communication with the laser diode array and the positive and negative terminal blocks, the electrical foils extending perpendicularly away from the emission surface, wherein the positive and negative electrical terminal blocks are electrically isolated from the heatsink; and
   an optical assembly located on the laser diode array within an emission path of the laser diode array, the optical assembly comprising a first optical component and at least a second optical component, wherein the first optical component is affixed to the at least one mounting plate by at least a first mounting tab having a first length, and wherein the at least second optical component is affixed to the at least one mounting plate by at least a second mounting tab having at least a second length, and wherein the first and at least second lengths correspond to a distance between the laser diode array and the optical assembly, and wherein a cross-sectional footprint of the heatsink, positive and negative electrical terminal blocks, electrical foils, and optical assembly is not larger than 120% of a cross-sectional footprint of the laser diode array.

2. The apparatus of claim 1, wherein the laser diode array, positive and negative electrical terminal blocks, and electrical foils are soldered to the heatsink.

3. The apparatus of claim 1, wherein the optical assembly does not extend beyond the cross-sectional footprint of the laser diode array.

4. The apparatus of claim 1, wherein the first and at least second mounting tabs are soldered to the at least one mounting plate and to the first and at least second optical components, respectively.

5. The apparatus of claim 1, wherein the first and at least second mounting tabs are welded to the at least one mounting plate and to the first and at least second optical components, respectively.

6. The apparatus of claim 1, wherein the positive and negative electrical terminal blocks are oriented in the same direction.

7. The apparatus of claim 1, wherein the electrical foils are located adjacent to the heatsink.

8. The apparatus of claim 1, wherein the electrical foils are connected to the laser diode array at opposite edges of the laser diode array.

9. The laser diode apparatus of claim 1, comprising a plurality of mounting plates affixed across at least one side of the mounting surface.

10. The laser diode apparatus of claim 9, wherein the first optical component is affixed to the plurality of mounting plates by a plurality of first mounting tabs having a first length, and wherein the at least second optical component is affixed to the plurality of mounting plates by a plurality of at least second mounting tabs having at least a second length.

11. A method of manufacturing a laser diode assembly, comprising the following steps:

mechanically coupling a laser diode array and a heatsink, wherein the laser diode array has an emission surface and a mounting surface, wherein at least one mounting plate is affixed to the mounting surface, wherein the heatsink extends perpendicularly away from at least one edge of the emission surface, wherein the emission surface and the heatsink are in thermal communication;

mechanically coupling positive and negative electrical terminal blocks with the heatsink opposite the laser diode array;

electrically coupling electrical foils with the laser diode array and the positive and negative terminals, the electrical foils extending perpendicularly away from the emission surface, wherein the positive and negative electrical terminal blocks are electrically isolated from the heatsink; and mechanically coupling an optical assembly on the laser diode array within an emission path of the laser diode array, the optical assembly comprising a first optical component and at least a second optical component, wherein the first optical component is affixed to the at least one mounting plate by at least a first mounting tab having a first length, and wherein the at least second optical component is affixed to the at least one mounting plate by at least a second mounting tab having at least a second length, and wherein the first and at least second lengths correspond to a distance between the laser diode array and the optical assembly, and wherein a cross-sectional footprint of the heatsink, positive and negative electrical terminal blocks, electrical foils, and optical assembly is not larger than 120% of a cross-sectional footprint of the laser diode array.

12. The method of claim 11, wherein the laser diode array, positive and negative electrical terminal blocks, and electrical foils are soldered to the heatsink.

13. The method of claim 11, wherein the optical assembly does not extend beyond the cross-sectional footprint of the laser diode array.

14. The method of claim 11, wherein the first and at least second mounting tabs are soldered to the at least one mounting plate and to the first and at least second optical components, respectively.

15. The method of claim 11, wherein the first and at least second mounting tabs are welded to the at least one mounting plate and to the first and at least second optical components, respectively.

16. The method of claim 11, wherein the electrical foils are located adjacent to the heatsink.

17. A method of attaching optical components to a laser diode array, comprising the following steps:

flowing solder along at least a portion of a first and at least second optical components;

positioning first and at least second mounting tabs on the first and at least second optical components, respectively, at a location of the flowed solder, wherein the first mounting tab has a first length, and wherein the at least second mounting tab has at least a second length, and wherein the first and at least second lengths correspond to a mounted distance between the laser diode array and the first and at least second optical components, respectively;

flowing solder along at least a portion of the laser diode array;

positioning at least one mounting plate on the laser diode array at a location of the flowed solder; and attaching the first and at least second mounting tabs to the at least one mounting plate by at least one from the set of: soldering and welding.

18. The method of claim 17, wherein the first and at least second optical components are positioned one on top of another and within a cross-sectional footprint of the laser diode array.

19. The method of claim 17, wherein at least one of the first and at least second optical components comprises at least one pedestal extending from a surface of the at least one optical component, and wherein the solder is flowed along the at least one pedestal.

20. The method of claim 17, wherein at least one of the first and at least second mounting tabs is soldered to more than one of the first and at least second optical components.

* * * * *